(12) United States Patent  
Currier et al.

(10) Patent No.: US 11,450,616 B2  
(45) Date of Patent: Sep. 20, 2022

(54) USING A BACKSIDE MASK LAYER FOR FORMING A UNIQUE DIE MARK IDENTIFIER PATTERN

(71) Applicant: NXP USA, Inc., Austin, TX (US)

(72) Inventors: David Robert Currier, Mesa, AZ (US); Darrell Glenn Hill, Chandler, AZ (US); Fred Reece Clayton, Mesa, AZ (US); Alan J. Magnus, Gilbert, AZ (US); Warren Crapse, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 40 days.

(21) Appl. No.: 16/942,596

(22) Filed: Jul. 29, 2020

(65) Prior Publication Data

US 2022/0037264 A1   Feb. 3, 2022

(51) Int. Cl.
  *H01L 23/544*   (2006.01)
  *H01L 21/027*   (2006.01)
  *H01L 21/768*   (2006.01)
  *G03F 7/20*     (2006.01)
  *G03F 7/09*     (2006.01)

(52) U.S. Cl.
  CPC ............ *H01L 23/544* (2013.01); *G03F 7/092* (2013.01); *G03F 7/70683* (2013.01); *H01L 21/0274* (2013.01); *H01L 21/76805* (2013.01)

(58) Field of Classification Search
  CPC .............. H01L 23/544; H01L 21/0274; H01L 21/76805
  USPC .................................................. 438/401, 460
  See application file for complete search history.

(56) References Cited

U.S. PATENT DOCUMENTS

| 6,432,796 | B1 | 8/2002 | Peterson |
| 7,807,573 | B2 | 10/2010 | Li et al. |
| 8,173,552 | B2 | 5/2012 | Vakanas et al. |
| 8,835,229 | B2 | 9/2014 | Banach et al. |
| 9,385,040 | B2 | 7/2016 | Tsai et al. |
| 9,613,912 | B2 | 4/2017 | Scanlan |
| 10,157,792 | B2 | 12/2018 | Zhang et al. |
| 10,373,913 | B2 | 8/2019 | Scanlan |
| 2010/0207283 | A1 | 8/2010 | Wu et al. |
| 2015/0255373 | A1* | 9/2015 | Watanabe ............... H01L 24/94 438/5 |
| 2018/0151507 | A1 | 5/2018 | Chen et al. |

FOREIGN PATENT DOCUMENTS

WO   WO2006944399 A1   4/2006

* cited by examiner

Primary Examiner — Quoc D Hoang (57) ABSTRACT

A method of making a semiconductor device is provided for depositing, patterning, and developing photoresist (1703, 1704) on an underlying layer located on a backside of a wafer having a frontside on which an integrated circuit die are formed over a shared wafer semiconductor substrate and arranged in a grid, thereby forming a patterned photoresist mask with a unique set of one or more openings which are used to selectively etch the underlying layer to form, on each integrated circuit die, a unique die mark identifier pattern of etched openings in the underlying layer corresponding to the unique set of one or more openings in the patterned photoresist mask (1705), where the patterned photoresist mask is removed (1706) from the backside of the wafer before singulating the wafer to form a plurality of integrated circuit devices (1708) which each include a unique die marking.

17 Claims, 8 Drawing Sheets

USING A BACKSIDE MASK LAYER FOR FORMING A UNIQUE DIE MARK IDENTIFIER PATTERN

BACKGROUND OF THE INVENTION

Field of the Invention

The present invention is directed in general to integrated circuit devices and methods for manufacturing same. In one aspect, the present invention relates to a wafer fabrication process and apparatus for marking and identifying individual integrated circuit die.

Description of the Related Art

Integrated circuit (IC) chips (or "dies") are produced by simultaneously fabricating multiple ICs on a semiconductor wafer that can then be singulated into individual die by sawing/cutting through the wafer and/or removing a portion of the wafer to form individual IC chips. The fabrication process is generally divided into a front-end manufacturing phase and back-end manufacturing phase, each involving potentially hundreds of steps. During front-end manufacturing, each IC die on the wafer is typically identical and contains circuits formed by electrically connecting active and passive components. Back-end manufacturing can involve singulating individual semiconductor die from the finished wafer and packaging the die to provide structural support and environmental isolation. However, the yield of chips from each wafer is not 100% because of defects during the manufacturing process. Accordingly, there are manufacturing and quality control processes which require the ability to trace a completed product back to the specific die used, as well as to any information associated with that die, such as location within the wafer, inline and final test data, etc. In order to keep track of the dies, each die unit on a wafer is assigned a unique identifier (Die ID), and each wafer is assigned to a grouping of wafers such as a lot. The die IDs can be of any format and one convention is to use the coordinate position of the dies on the wafer as an identifier (or part of a die's identifier) where the die IDs may include information identifying the lot for the die unit. While there are existing fabrication solutions to provide "die traceability" so that any completed product can be traced back to the specific die, such solutions require unique labels for every die within a wafer, and typically add significant fabrication processing complexity when existing wafer patterns are defined by step-and-repeat operations (which of course preclude uniqueness). For example, there are existing die labeling processes that use direct laser marking of the die, but there are significant shortcomings with laser etching approach, including but not limited to decreased mechanical strength of the die and the requirement of additional fabrication processing steps, such as adding marking film to the overall fabrication process that is processed to sequentially mark each die. Another drawback with existing solutions is that the marking labels themselves occupy die area, often resulting in an increase in die size and cost. Die size is particularly sensitive for newer wafer substrate materials, such as Silicon Carbide (SiC) or Gallium Nitride (GaN), which have higher costs per unit die area than for silicon-based wafers. Simultaneously, the relative immaturity of GaN wafers, together with the defectivity inherent in heteroepitaxy (GaN on SiC), make die traceability even more important for these products.

As seen from the foregoing, the existing solutions for providing die marking on individual integrated circuit devices are extremely difficult at a practical level by virtue of the challenges with balancing tradeoffs posed between providing die traceability to meet the applicable performance, design, complexity and cost constraints without changing the design process steps or otherwise degrading other important device properties. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A unique die mark is provided for each integrated circuit die during wafer fabrication processing by using a photolithography-defined etching of the backside of wafers, such as GaN/SiC and other technologies employing transparent substrates, to add a unique die mark label to every die on a wafer without increasing cost, die size or process complexity, thereby enabling die traceability for each die on the wafer. As will be appreciated, any suitable marking may be used for the unique die mark label, including but not limited to an alphanumeric label, bar coding, binary pattern, or any other pattern which is unique at the die level. In cases where the unique die mark label is formed on the backside of a transparent wafer, the labels may be read using an optical microscope which can penetrate the transparent wafer substrate. However, in flip-chip or inverted die packages, the backside unique die mark label may be read directly. In selected embodiments, the unique die marks are formed on the wafer backside by incorporating a die mark pattern into the backside mask for forming through-wafer vias. Applying one or more etch processes, the backside mask is used to etch openings into the wafer backside or any underlying backside layer, including through-wafer via openings and unique id die mark openings having width-constrained dimensions. In selected embodiments, the etched openings may be filled or lined with a conductive backside metal to create the unique die mark label. In the disclosed approach, the unique die mark labels are added simultaneously to all die on a wafer, thereby eliminating the need to perform single step-and-repeat operations for each die so that no process change is required to implement unique labels across the entire wafer. While the unique die mark labels may be located on the backside locations where there is a clear viewing through the substrate from the frontside, in other embodiments, the unique die mark labels can overlap with "keep-out" regions and other frontside features without violating design rules when optical observations can be conducted at different focal planes or depths, thereby further mitigating or eliminating any impact on die size. Thus, the present disclosure achieves die-level traceability with no impact on process complexity and little or no impact on die size.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 1:
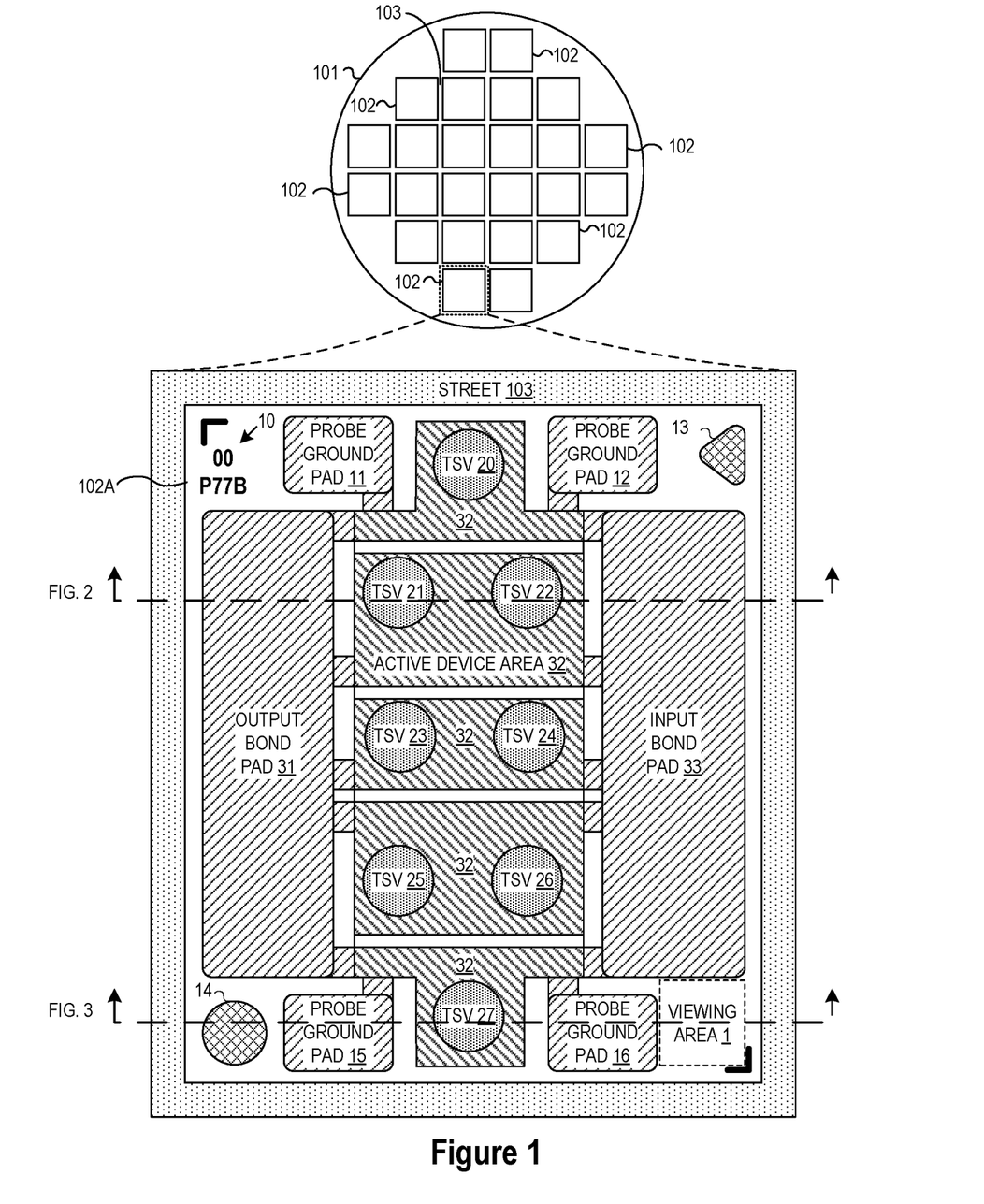
FIG. 1 is a simplified plan frontside view of a semiconductor wafer and one of its constituent integrated circuit die which has different layout features noted in accordance with selected embodiments of the present disclosure.

To provide additional details for an improved understanding of selected embodiments of the present disclosure, reference is now made to FIG. 1 which depicts a simplified plan frontside view of a semiconductor wafer 100 having a plurality of integrated circuit die 102 formed with a base substrate material 101, such as, without limitation, silicon, germanium, gallium arsenide (GaAs), indium phosphide (InP), gallium nitride (GaN), silicon carbide (SiC), barium tin oxide (BaSnO), or the like, for structural support. In selected embodiments, the base substrate material 101 provides a substrate that is transparent or translucent to optical radiation, such as UV, visible, or infrared electromagnetic radiation. The plurality of integrated circuit die 102 is formed on the wafer 100 and separated from one another by a non-active, inter-die wafer area or saw street lines 103. The saw street lines 103 define cutting areas to singulate the semiconductor wafer 100 into the individual semiconductor die 102.

Figure 2:
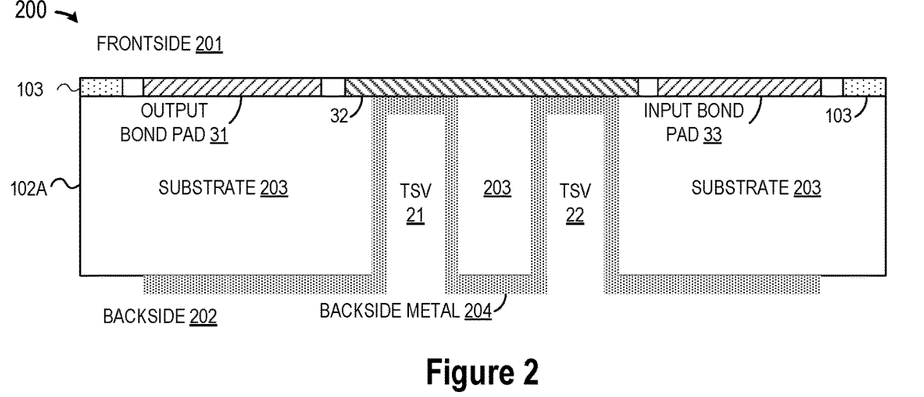
FIGS. 2-4 show different cross-sectional views of the integrated circuit die of FIG. 1 to illustrate where viewing areas are located for locating a backside die mark in accordance with selected embodiments of the present disclosure.

As depicted the enlarged view of the integrated circuit die 102A, each constituent integrated circuit die 102 has different layout features disposed on the front side. In an embodiment where the integrated circuit die 102A is a GaN product die, the major features may include an output bond pad 31, input bond pad 33, and probe ground pads 11-12, 15-16 which are peripherally disposed around and connected to an interior active device area 32 which includes a plurality of through-semiconductor vias (TSVs) 20-27 which extend vertically from the wafer/substrate backside to the wafer/substrate frontside where they are electrically connected to circuit features (not shown) formed on the frontside. The frontside layout features may also include a mask identifying mark 10 at a first corner of the integrated circuit 102A to be visible and readable by optical inspection for communication of the information stored, linked, or presented by the identifying mark 10. In addition, the frontside layout features may include one or more fiducial markings 13, 14 which are positioned at respective corners to provide a circuit pattern recognition mark or reference point for alignment in mask printing and mounting. In this example, there is an open viewing area 1 on the front of the die which is not otherwise occupied with any features. If desired, the wafer frontside viewing area 1 could be used for a unique die label if the process included any single step (lx) plates on the wafer frontside process, but this solution would increase the cost and process complexity to the device fabrication. With the arrangement and positioning of the wafer frontside of the integrated circuit 102A, it will be seen that the frontside layout features 10-16, 20-27, 31-33 provide an obstruction for optically seeing through the base substrate material 101 to the wafer backside of the integrated circuit 102A For example, reference is now made to FIG. 2 which depicts a first cross-sectional view 200 of the integrated circuit die 102A along the "FIG. 2" sightline of FIG. 1 to provide additional details for an improved understanding of selected embodiments of the present disclosure. As illustrated, the integrated circuit die 102A is formed with a semiconductor substrate 203 having a wafer frontside 201 and backside 202. On the wafer frontside 201, a number of features are formed which prevent optical inspection of the features on the wafer backside 202 through the substrate 203. In particular, the frontside features include metallization layers for the output bond pad 31, interior active device area 32, and input bond pad 33 formed to substantially cover the area between the saw street lines 103. In addition, there are TSVs 21, 22 formed on the wafer backside 202 with a backside metallization layer 204 which extends along the sidewall and bottom surfaces of the through wafer openings formed on the substrate 203. With the arrangement and positioning of the features 31-33 on the wafer frontside 201, there is little or no opportunity to optically inspect the wafer backside 202 through the substrate 203 of the integrated circuit 102A.

Figure 3:
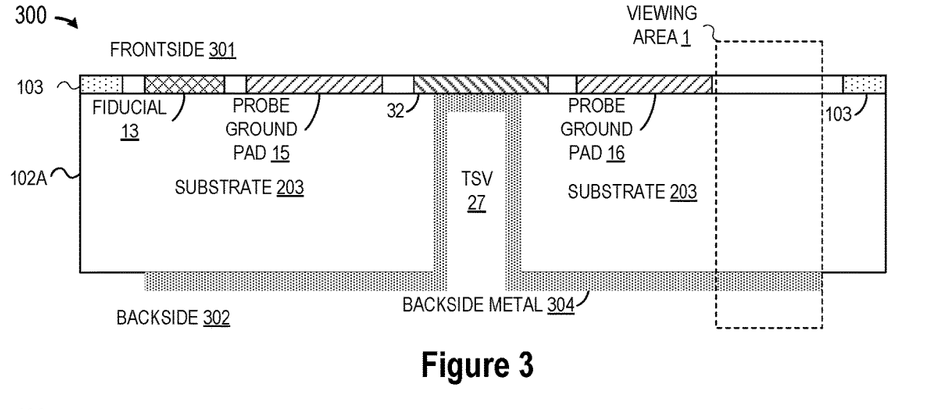

Turning now to FIG. 3, there is depicted a second cross-sectional view 300 of the integrated circuit die 102A along the "FIG. 3" sightline of FIG. 1 to provide additional details for an improved understanding of selected embodiments of the present disclosure. At this cross-section, the wafer frontside 301 of the integrated circuit die 102A includes features which prevent optical inspection of the wafer backside 302 through the substrate 203, but there is also a viewing area 1 which is characterized by the absence of any features on the wafer frontside 301. In particular, the wafer frontside 301 includes a fiducial marker 13 and one or more metallization layers for the probe ground pad 15, interior active device area 32, and probe ground pad 16 which are formed between the saw street lines 103 to leave unimpeded the viewing area 1. In addition, there is a TSV 27 formed on the wafer backside 302 with a backside metallization layer 304 which extends along the sidewall and bottom surfaces of the through wafer openings formed on the substrate 203. With the arrangement and positioning of the features 13, 15, 32, 16 on the wafer frontside 301, the viewing area 1 provides the opportunity to optically inspect the wafer backside 302 through the substrate 203 of the integrated circuit 102A.

Figure 4:
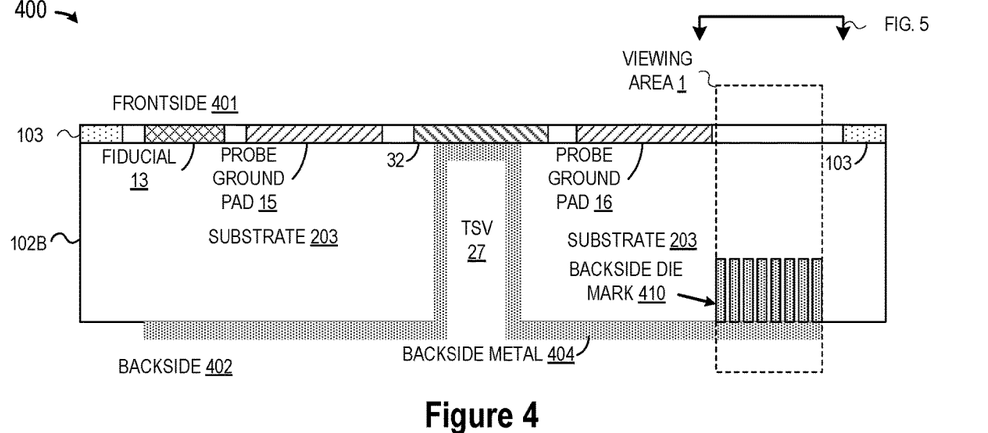

To illustrate how the viewing area 1 may be used to provide a unique backside die mark in accordance with selected embodiments of the present disclosure, reference is now made to FIG. 4 which depicts a cross-sectional view 400 of the integrated circuit die 102B along the same cross section as shown in FIG. 3, but with a backside die mark 410 formed on the wafer backside 402 in the viewing area 1. At this cross-section, the wafer frontside 401 includes the fiducial marker 13 and metallization layers for the probe ground pad 15, interior active device area 32, and probe ground pad 16 which prevent optical inspection of the wafer backside 402 through the substrate 203, but which also leave "open" a viewing area 1. In addition to the TSV 27 formed on the wafer backside 402, the integrated circuit die 102B includes backside die mark 410 which is positioned in the viewing area 1. In this position, the die mark 410 can be optically inspected from the frontside 401.

As illustrated, the depicted backside die mark 410 is depicted as a simplistic, repetitive pattern of etch openings in the wafer backside 402 that are defined and controlled to etch only partway into the substrate 203. In a real world application, a GaN-on-SiC die substrate 203 may include TSV substrate openings (e.g., TSV 27) which are etched through the entire width (e.g., 100 μm) of the substrate 203 using backside TSV pattern features having a first size dimension (e.g., 30×70 μm). However, to prevent the backside die mark 410 from extending completely through the substrate 203, the substrate openings for the backside die mark 410 are etched to only a limited depth (e.g., 70-76 μm) using backside mark pattern features having a second, smaller size dimension (e.g., 10×40 μm). If desired, even shallower depths for the backside die mark 410 could be obtained by using 10×10 or 10×20 μm features instead.

As will be appreciated, any suitable identification pattern may be used at the die mark 410 to uniquely convey die identification information for the specific integrated circuit 102B. For example, reference is now made to FIG. 5 which is a simplified plan view of an example backside die mark which may be located in a viewing area in accordance with selected embodiments of the present disclosure.

Figure 5:
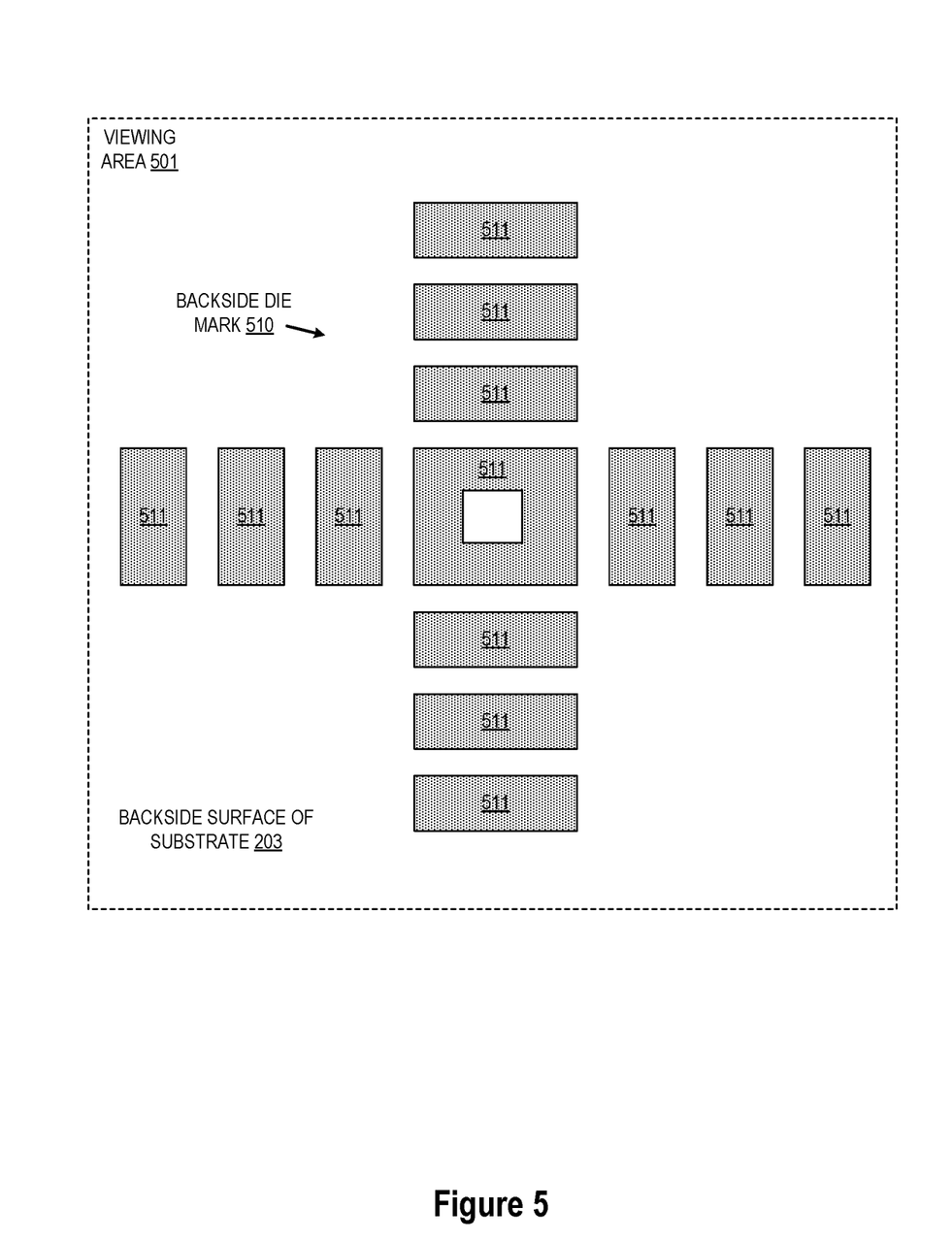
FIG. 5 is a simplified plan view of an example backside die mark which may be located in a viewing area in accordance with selected embodiments of the present disclosure.

To provide additional details for an improved understanding of selected embodiments of the present disclosure, reference is now made to FIG. 5 which depicts a plan view 500 of the backside die mark 510 along the "FIG. 5" sightline of FIG. 4 to provide additional details for an improved understanding of selected embodiments of the present disclosure. While a simple cross-shaped backside die mark 510 is shown as being formed in the backside surface of the substrate 203 with a plurality of etched openings that are filled with a plated metal 511 and that are located in the viewing area 501, it will be appreciated that any desired die identification marking design may be used to uniquely identify the integrated circuit die, including but not limited to an alphanumeric label, bar coding, binary pattern, or any other pattern which is unique at the die level. For example, a bar code die mark could have different sized etched openings forming a pattern of parallel lines of varying widths and spacing distances to provide a machine-readable code for uniquely identifying the integrated circuit 102. Thus, if the backside die mark 410 is a bar code used to indicate the reticle position within the wafer (shot number), and the frontside label 10 is the instance or die number within the reticle, these two pieces of information are sufficient for unique identification of the die within the wafer.

As shown in FIG. 1, each indicated integrated circuit die 102 may represent a single die, but may instead represent a grid or array of die, such as 100 die arranged in a 10×10 array. Thus, each "integrated circuit die 102" could correspond to a specific "reticle position (shot number)." In such embodiments, the backside die mark for all 100 of those die on an individual block 102 would be the same, because they are in the same "reticle position/shot number." However, the frontside label (e.g., 10) would be different for each of the 100 die (e.g., numbered from 0 to 99). Thus, the backside die mark would indicate which of the squares 102 the individual die came from, and the frontside label 10 would give the location of the die within that square. In effect, the backside die mark would be like the name of the city, and then the frontside label would be like the street address—both are needed for unique identification.

Referring back to FIGS. 1 and 4, the frontside label (FIG. 1, 10) and backside label (FIG. 4, 410) are shown as being located in non-overlapping positions of the integrated circuit die 102, but this is done only for the sake of clarity in the illustration. Indeed, the differences in focal planes between the frontside and backside surfaces (e.g., when the backside die marking 410 is located at least 20 μm below the frontside label) allow the backside and frontside labels to partially or completely overlap and still be completely legible in any ordinary optical microscope by simply changing the focus depth. As a result, the backside die marking 410 can generally be located anywhere within the integrated circuit die 102 which is not obscured by large frontside metal patterns without causing any issues in terms of design rule violations, performance impact, or legibility.

In contrast to die labeling solutions which require additional processing or marking steps (such as sequentially forming labels on each die with a high-power laser engraving tool), selected embodiments of the present disclosure provide a wafer-level die marking technique which uses backside photolithography and etch processes to etch die identification markings into the backside of an unsingulated semiconductor wafer without requiring additional processing layers or the retention of photosensitive material on the wafer backside surface. For example, there are existing backside photolithography and etch processes used with processing transparent semiconductor substrates, such as GaN, SiC, and GaAs, that can be modified to create unique backside die marks on each wafer/substrate backside that are transparently visible at infrared wavelengths, or in the case of flip-chip or inverted die packaging, directly visible.

Figure 6:
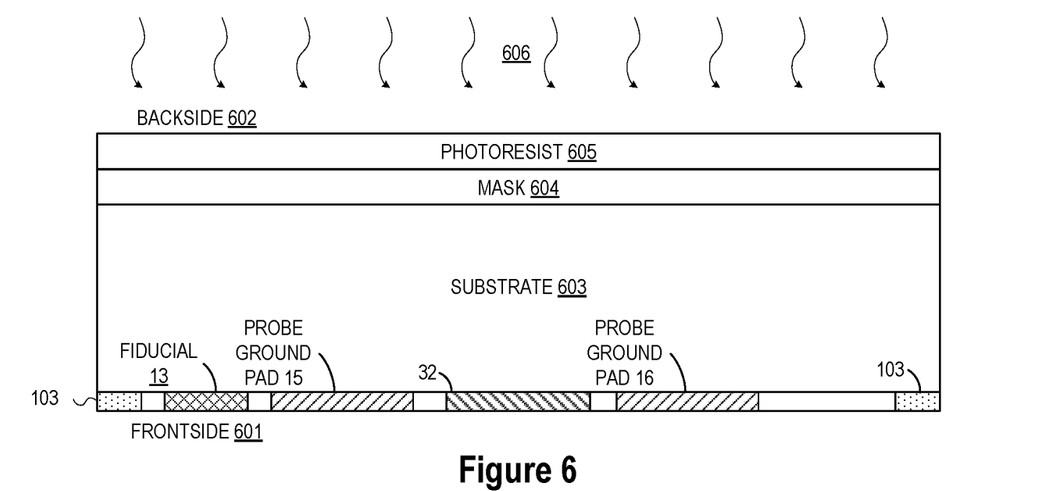
FIGS. 6-10 depict cross-sectional views of a first sequence of fabrication processing steps for fabricating a backside die mark when etching the backside metal with a backside via etch process in accordance with selected embodiments of the present disclosure.

To describe a first example embodiment for using backside photolithography and etch processes to fabricate unique backside die marks, reference is now made to FIGS. 6-10 which depict cross-sectional views of a first sequence of fabrication processing steps for fabricating a backside die mark when etching the backside metal with a backside via etch process in accordance with selected embodiments of the present disclosure. In particular, FIG. 6 is a simplified cross-sectional view 600 of an integrated circuit semiconductor substrate 603 having a frontside or active surface 601 and a backside surface 602. For specificity, the semiconductor substrate 603 may be formed as a GaN substrate, though any semiconductor material may be used for the semiconductor substrate 603. At the stage of fabrication shown in FIG. 6, a fiducial marker 13 and metallization layers for the probe ground pad 15, interior active device area 32, and probe ground pad 16 are formed on the wafer frontside 601. And in preparation for backside via formation, one or more masking layers are formed on the opposite wafer backside 602 for use in patterning and etching the backside 602 of the substrate 603. For example, a first masking layer 604, alone or in combination with an anti-reflective coating (not shown), may be formed on the wafer backside 602 with any suitable masking material (such as by depositing a layer of indium tin oxide or nickel) to a predetermined thickness using any desired technique, such as chemical vapor deposition (CVD), plasma-enhanced chemical vapor deposition (PECVD), physical vapor deposition (PVD), atomic layer deposition (ALD), or the like. On the masking layer 604, a photoresist layer 605 may be formed from any appropriate photoresist material (e.g., 193 nm resist) that is patterned (e.g., using a 193 nm develop) process. In selected example embodiments, a layer of photoresist 605 is deposited to a predetermined thickness that is selected to provide a light sensitive material that, when exposed to light 606 using a patterned mask which blocks some of the light so that only unmasked regions of the material 6095 will be exposed to light.

Figure 7:
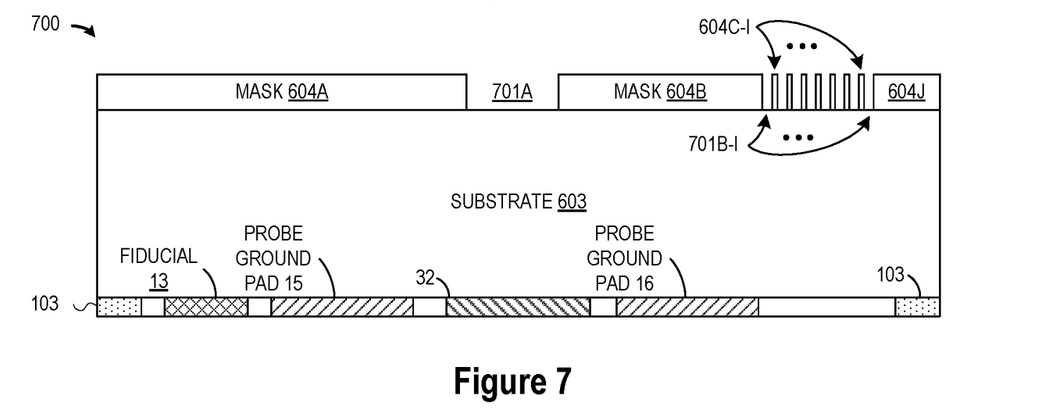

Turning now to FIG. 7, there is shown a simplified cross-sectional view 700 of the integrated circuit semiconductor substrate 603 subsequent to FIG. 6 after the photoresist 605 is developed into a resist pattern (not shown) for use in selectively etching the mask layer 604 to form mask openings 701A-I. While any suitable photolithography and etch process may be used, the patterned photoresist layer 605 may be removed by applying a solvent to dissolve away the regions of the photoresist layer 605 that were exposed to light, leaving behind a coating where the patterned image mask was placed (in the case of positive photoresist) or was not placed (in the case of negative photoresist). The patterned photoresist may then be transferred to the mask layer 604 using one or more etching steps to selectively remove the unprotected portions of the mask layer 604, including a dry etching process such as reactive-ion etching, ion beam etching, plasma etching or laser etching, a wet etching process wherein a chemical etchant is employed or any combination thereof. As shown in FIG. 7, the patterned photoresist is removed after the etch process using any desired chemical etch or strip process, leaving behind a patterned mask layer 604A-J having a first mask opening 701A and a plurality of second mask openings 701B-I in the patterned mask layer 604A-J.

Figure 8:
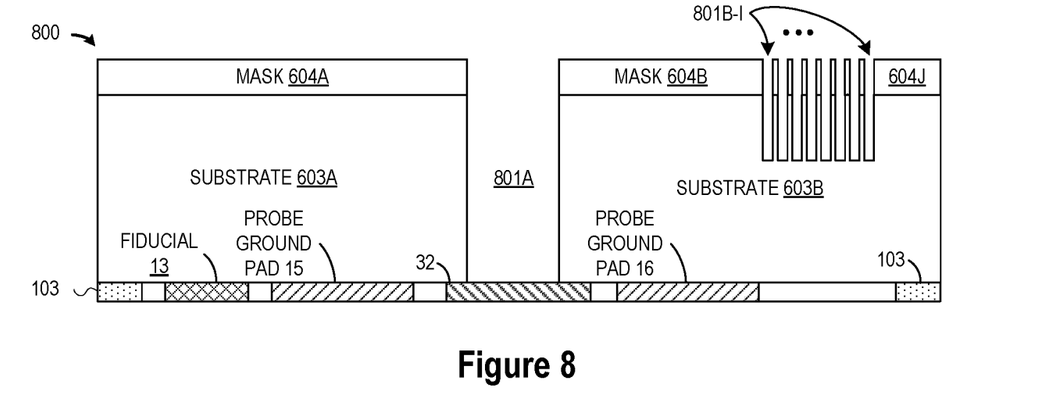

Turning now to FIG. 8, there is shown a simplified cross-sectional view 800 of the integrated circuit semiconductor substrate 603 subsequent to FIG. 7 after the patterned mask layer 604A-J is used to selectively etch exposed portions of the substrate 603A/B to form one or more first etch openings 801A and one or more second etch openings 801B-I. With the patterned etch mask layer 604A-J in place, portions of the semiconductor substrate 603 exposed by the mask openings 701A-I may be selectively etched or removed using one or more etching steps to selectively remove the unprotected portions, such as by using a dry etching process (such as reactive-ion etching, ion beam etching, plasma etching or laser etching), a wet etching process (wherein a chemical etchant is employed) or any combination thereof. By choosing an anisotropic etch chemistry that is selective to the semiconductor material of the substrate 603, only the exposed portions of the substrate 603 are removed when forming the etch openings 801A-I. And by controlling the dimension sizes of the mask openings 701A-I in the patterned mask 604A-J, the depth of the etch openings may be controlled. For example, the dimension size of the first mask opening 701A is controlled so that the etch process that forms the opening 801A stops at the metallization layer for interior active device area 32. In addition, the dimension size of the each of the second mask openings 701B-I may be controlled so that the etch process that forms the one or more etch openings 801B-I stops after etching only partially through the substrate 603B.

Figure 9:
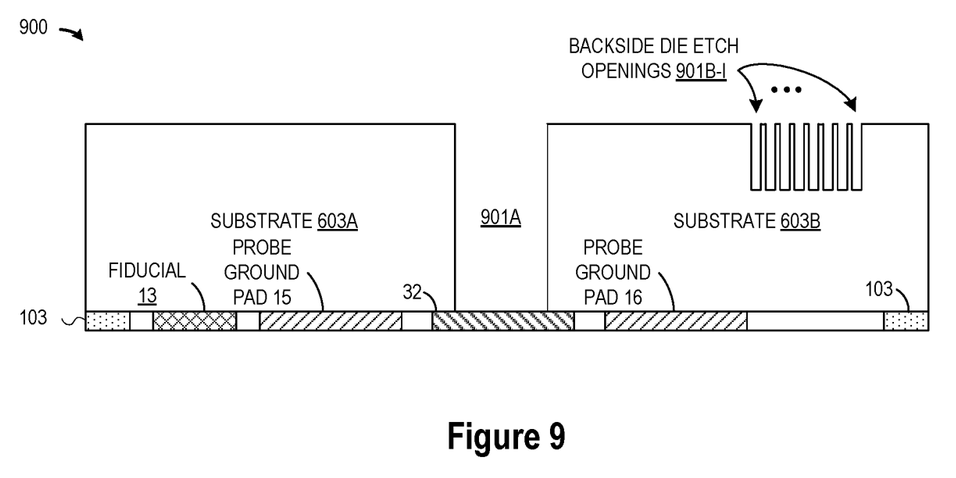

Turning now to FIG. 9, there is shown a simplified cross-sectional view 900 of the integrated circuit semiconductor substrate 603 subsequent to FIG. 8 after the patterned mask layer 604A-J is removed to form the TSV openings 901A and one or more backside die etch openings 901B-I positioned in the substrate 603A/B as shown. When removing the patterned mask layer 604A-J, any desired stripping process may be used that is capable of selectively removing the mask layer material, including but not limited to, one or more wet etching processes wherein a chemical etchant is employed to remove the patterned mask layer 604A-J. For example, an isotropic or wet etch process may be employed by using a silicon nitride etch chemistry, such as a hot phosphoric acid ($H_3PO_4$) solution or another appropriate selective etchant to remove the nitride mask layer 604A-J while leaving in place the semiconductor substrate 603A/B. After removal of the mask layer 604A-J, the TSV opening 901A may have a depth-to-diameter ratio of 3:1, for example. In selected embodiments, the TSV opening 901A may have a depth-to-diameter ratio of 10:1. In such embodiments, the TSV opening 901A may have depths approximately 75 microns and larger, and diameters approximately 10 microns and larger. However, the aspect ratio of each backside die etch opening 901B-I may be controlled through the pattern and etch process to be much higher than for the TSV via opening 901A since the etch rate through the smaller second mask openings 701B-I is much lower.

Figure 10:
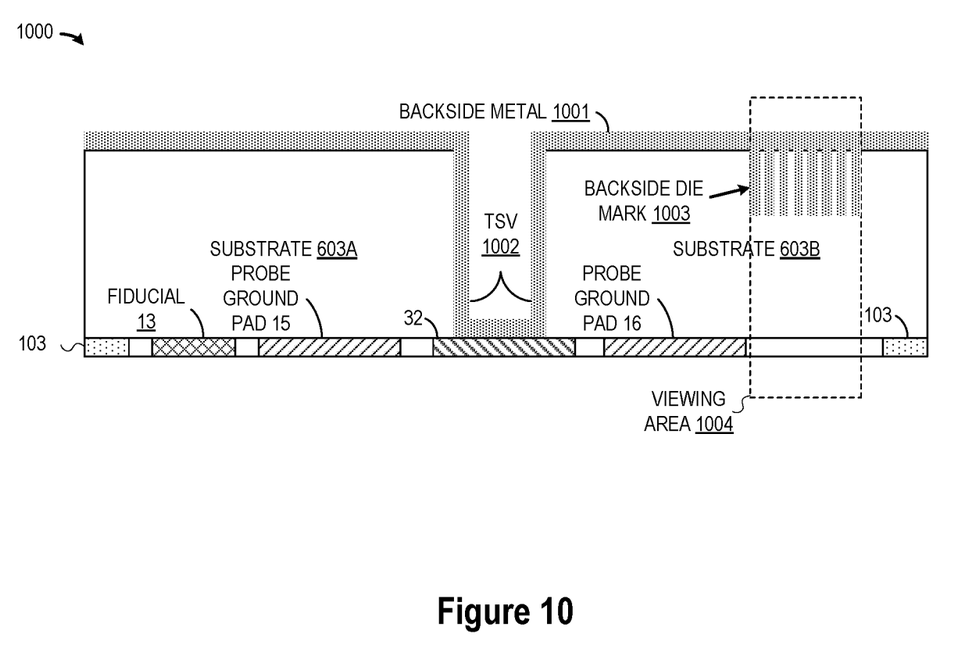

Turning now to FIG. 10, there is shown a simplified cross-sectional view 1000 of the integrated circuit semiconductor substrate 603 subsequent to FIG. 9 after forming a backside metal layer 1001 over at least part of the backside die etch openings 901A-I, thereby forming an example TSV 1002 and backside die mark 1003. While any suitable backside metallization process may be used, the backside metal 1001 may be formed with one or more conductive layers, such as by depositing a first barrier layer (not shown)

using an electroless plating process. The barrier layer may be formed with titanium (Ti), titanium nitride (TiN), tantalum (Ta), tantalum nitride (TaN), nickel (Ni), cobalt (Co), boron (B), or any suitable combination of these and other materials, and may include nickel boron (NiB) material to serve as a seed layer for plating or metallization. On the barrier layer, a conductive liner layer 1001 may be deposited by way of an electroplating process or other suitable conformal deposition process. For example, a gold (Au) layer may be deposited as the liner layer 1001 over the barrier layer. After deposition of the barrier layer and liner layer 1001, a slightly reduced via opening remains in the final TSV structure 1002. In addition, the backside die etch openings 901B-I are at least lined or completely filled by the deposited barrier and liner layers 1001, thereby forming the backside die mark 1003 which is positioned within the viewing area 1004.

Figure 11:
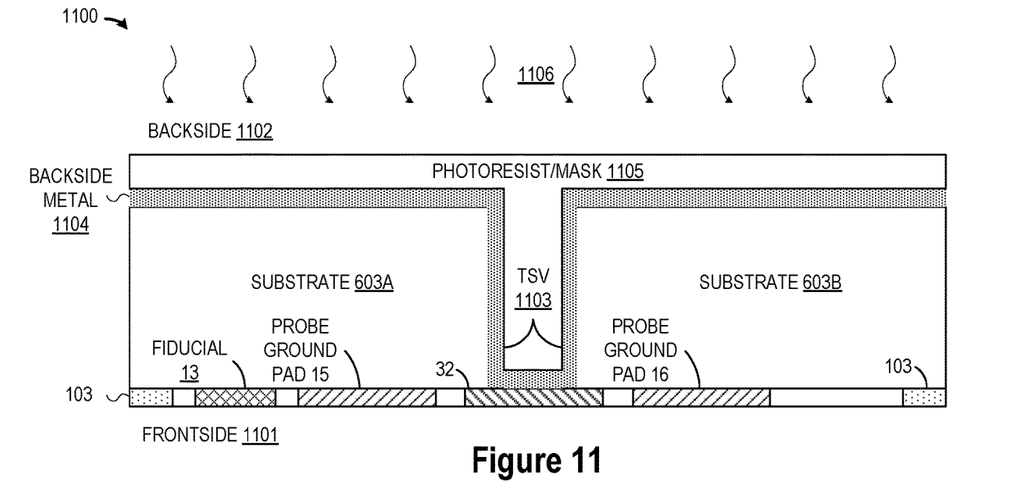
FIGS. 11-13 depict cross-sectional views of a second sequence of fabrication processing steps for fabricating a backside die mark when etching a through-semiconductor via conductor layer with a photolithography step in accordance with selected embodiments of the present disclosure.
Figure 12:
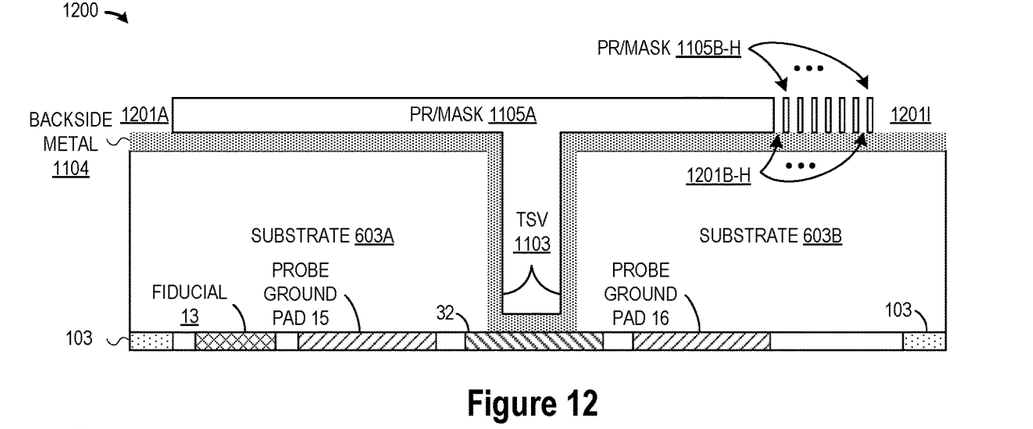
Figure 13:
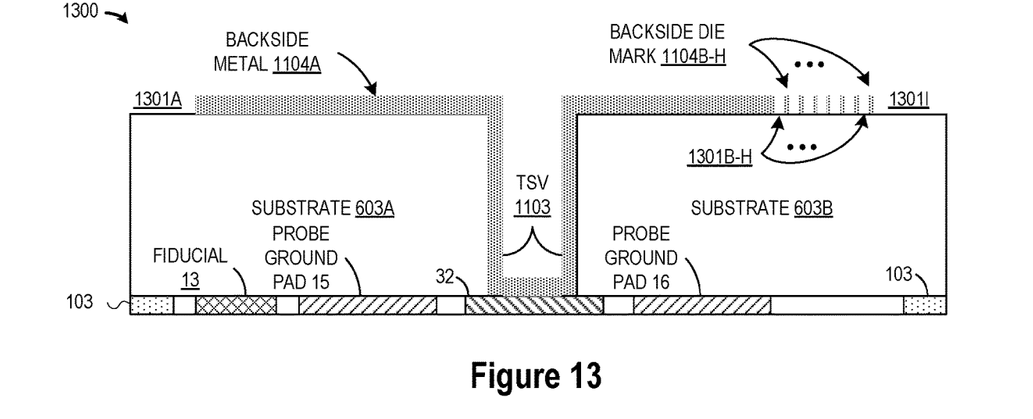

To describe a second example embodiment for using backside photolithography and etch processes to fabricate unique backside die marks from the backside metallization, reference is now made to FIGS. 11-13 which depict cross-sectional views of a second sequence of fabrication processing steps. In particular, FIG. 11 is a simplified cross-sectional view 1100 of an integrated circuit semiconductor substrate 603 having a frontside or active surface 1101 and a backside surface 1102. At the stage of fabrication shown in FIG. 11, the fiducial marker 13 and metallization layers for the probe ground pad 15, interior active device area 32, and probe ground pad 16 have been formed on the wafer frontside 1101. In addition, a TSV 1103 has been formed on the wafer backside 1102 using any suitable sequence of processing steps for patterning and etching the backside 1102 of the substrate 603 to form a via opening, and then conformally depositing or plating one or more backside metal layers 1104 to line the via opening with the TSV conductors 1103. As illustrated at this stage, the backside metal layer(s) 1104 cover the entirety of the wafer backside 1102, including the areas aligned with the saw street lines 103. In preparation for removing at least portions of the backside metal layer(s) 1104 in alignment with the saw street lines 103, one or more photoresist and/or masking layers 1105 are formed on the wafer backside 1102 for use in patterning and etching the backside metallization 1104. For example, a photoresist layer 1105 may be formed from any appropriate photoresist material that is applied to a predetermined thickness to provide a light sensitive material that, when exposed to light 1106 using a patterned mask which blocks some of the light, can be developed to form a patterned photoresist over the backside metal layer(s) 1104. Alternatively, a multi-layer masking technique can be used to sequentially form a first anti-reflective coating (not shown), a second masking layer (such as a hardmask or TEOS layer), and a photoresist layer 1105.

Turning now to FIG. 12, there is shown a simplified cross-sectional view 1200 of the integrated circuit semiconductor substrate 603 subsequent to FIG. 11 after the photoresist/mask layer 1105 is processed into a patterned resist or mask 1105A-H having resist/mask openings 1201A-I for use in selectively etching the backside metal layer(s) 1104. While any suitable photolithography and etch process may be used, the patterned photoresist/mask layer 1105A-H may be formed by applying a solvent to dissolve away the regions of the photoresist layer 1105 that were exposed to light, leaving behind a coating where the patterned image mask was placed (in the case of positive photoresist) or was not placed (in the case of negative photoresist). As a result of the photolithographic processing steps, the patterned resist/mask layer 1105A-H includes peripheral resist/mask openings 1201A, 1201I defined over the saw street lines 103, along with a plurality of resist/mask openings 1201B-H over the intended backside die mark area.

Turning now to FIG. 13, there is shown a simplified cross-sectional view 1300 of the integrated circuit semiconductor substrate 603 subsequent to FIG. 12 after the patterned resist/mask layer 1105A-H is used to selectively etch exposed portions of the backside metal layer(s) 1104 to form one or more first peripheral etch openings 1301A, 1301I and one or more second etch openings 1301B-H. With the patterned etch mask layer 1104A-H in place, portions of the backside metal layer(s) 1104 exposed by the mask openings 1201A-I may be selectively etched or removed using one or more etching steps to selectively remove the unprotected portions, such as by using a dry etching process (such as reactive-ion etching, ion beam etching, plasma etching or laser etching), a wet etching process (wherein a chemical etchant is employed) or any combination thereof. By choosing an anisotropic etch chemistry, such as a reactive ion etching, to selectively remove exposed portions of the backside metal layer(s) 1104, peripheral openings 1301A, 1301I are formed or defined in the backside metal layer(s) 1104 over the saw street lines 103. In addition, a plurality of die mark openings 1301B-H is formed or defined in the backside metal layer(s) 1104, thereby forming the backside die mark 1104B-H. As shown in FIG. 13, the patterned photoresist/mask 1105A-H is removed after etching the backside metal layer(s) 1104 using any desired chemical etch or strip process, leaving behind a patterned backside metal 1104A which forms part of the TSV 1103 and a plurality of unetched backside metal features forming the backside die mark 1104B-H.

As disclosed herein, an alternative embodiment for using backside photolithography processes to fabricate unique backside die marks from backside metallization may form the patterned photoresist mask layer(s) before depositing the backside metal layer. In such embodiments, the backside metallization is applied as a pattern by first applying, patterning, and developing photoresist on the backside of the wafer, and then depositing the backside metallization layer with a plating process. In this approach, no etching is used, and the removal of the patterned photoresist layer leaves the unique die mark identifier pattern in place. In other embodiments, a new photoresist mask layer is added to the backside fabrication process (rather than using one of the existing mask layer processes), such as defining the backside die mark by a photoresist lift-off process. Such processes are commonly used in GaN device fabrication, and would not involve etching to create the backside die mark.

Figure 14:
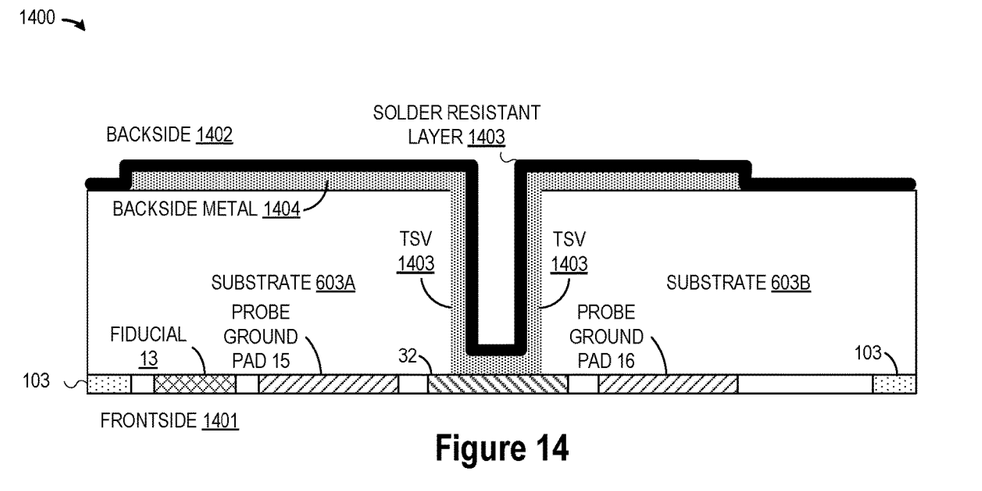
FIGS. 14-16 depict cross-sectional views of a third sequence of fabrication processing steps for fabricating a backside die mark when etching a solder-resistant layer formed on a through-semiconductor via conductor layer in accordance with selected embodiments of the present disclosure.
Figure 15:
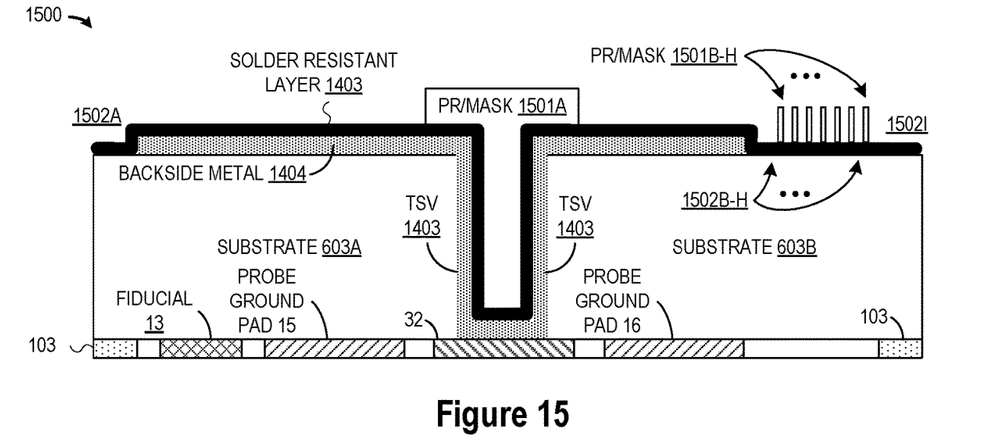
Figure 16:
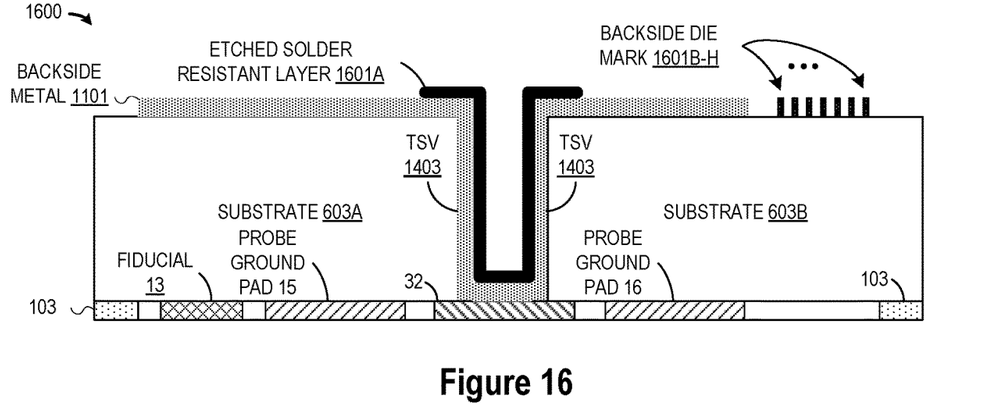

To describe a third example embodiment for using backside photolithography and etch processes to fabricate unique backside die marks from the a solder-resistant layer formed on the backside metallization, reference is now made to FIGS. 14-16 which depict cross-sectional views of a third sequence of fabrication processing steps. In particular, FIG. 14 is a simplified cross-sectional view 1400 of an integrated circuit semiconductor substrate 603 having a frontside or active surface 1401 and a backside surface 1402. At the stage of fabrication shown in FIG. 14, the fiducial marker 13 and metallization layers for the probe ground pad 15, interior active device area 32, and probe ground pad 16 have been formed on the wafer frontside 1401. In addition, a TSV 1403 has been formed on the wafer backside 1402 using any suitable sequence of processing steps for patterning and etching the backside 1402 of the substrate 603 to form a via opening, and then conformally depositing or plating one or more backside metal layers 1404 to line the via opening with the TSV conductors 1403. As illustrated at this stage, the backside metal layer(s) 1404 on the wafer backside 1402 have been patterned and etched to leave openings over at least the areas aligned with the saw street lines 103 and with the intended backside die mark area. And in preparation for protecting the TSV 1403 from subsequently formed solder contact materials, a solder resistant layer 1403 has been formed over the wafer backside 1102. Any suitable processing steps may be used to deposit a conformal layer of solder-resistant material on the patterned backside metal 1404, including the vertical sidewalls of the TSV 1403. For example, the solder resist layer 1403 may be applied, obtained, or otherwise provided, such as by depositing, for example, organic dielectric materials of one or more layers. As illustrated at this stage, the solder resistant layer 140 conformally covers the entirety of the patterned backside metal layer(s) 1404 and wafer backside 1402, including the areas aligned with the saw street lines 103.

Turning now to FIG. 15, there is shown a simplified cross-sectional view 1500 of the integrated circuit semiconductor substrate 603 subsequent to FIG. 14 after a patterned photoresist or mask layer 1501A-H is formed with defined resist/mask openings 1502A-I for use in selectively etching the solder resist layer 1403. For example, a photoresist layer (not shown) may be formed from any appropriate photoresist material that is applied over the entirety of the wafer backside to a predetermined thickness to provide a light sensitive material that can be exposed, developed, and etched or stripped to form a patterned photoresist over the solder resist layer 1403. Alternatively, a multi-layer masking technique can be used to sequentially form a first anti-reflective coating (not shown), a second masking layer (such as a hardmask or TEOS layer), and a photoresist layer that is exposed, developed, and etched or stripped to form a patterned photoresist over the solder resist layer 1403. While any suitable photolithography and etch process may be used, the patterned photoresist/mask layer 1501A-H includes one or more first TSV resist/mask elements 1501A that are positioned to protect the solder resistant layer 1403 over the TSV 1403, along with one or more second resist/mask elements 1501B-H that are positioned to protect portions of the solder resistant layer 1403 over the intended backside die mark area. However, the patterned resist/mask 1501A-H includes openings over at least the areas aligned with the saw street lines 103 and with the intended backside die mark area.

Turning now to FIG. 16, there is shown a simplified cross-sectional view 1600 of the integrated circuit semiconductor substrate 603 subsequent to FIG. 15 after the patterned resist/mask layer 1501A-H is used to selectively etch exposed portions of the solder resist layer 1403 that are exposed by the openings 1502A-I. With the patterned resist/mask layer 1501A-H in place, portions of the solder resist layer 1403 exposed by the mask openings 1502A-I may be selectively etched or removed using one or more etching steps to selectively remove the unprotected portions, such as by using a dry etching process (such as reactive-ion etching, ion beam etching, plasma etching or laser etching), a wet etching process (wherein a chemical etchant is employed) or any combination thereof. By choosing an etch chemistry to selectively remove exposed portions of the solder resist layer 1403, the etched solder resistant layer 1601A is left over the TSV 1403, along with the backside die mark 1601B-H. As shown in FIG. 16, the patterned photoresist/mask 1501A-H is removed after etching the solder resist layer 1403 using any desired chemical etch or strip process, leaving behind a patterned/etched solder resistant layer 1601A on the TSV 1403 and a plurality of unetched backside solder resistant layer elements forming the backside die mark 1601B-H.

As described hereinabove, there are at least three different existing, commonly used photolithography processes which can also be applied to create die marks on the backside of a thinned transparent wafer/substrate. The first photolithography process that defines through-wafer vias when etching the substrate with a "backside via" process can be augmented to simultaneously form unique die mark etchings in the substrate that are subsequently coated and/or filled with the backside metallization layer. The second photolithography process that removes portions of the full-thickness backside metallization layer when etching the backside metallization with a "street" process can be augmented to simultaneously form unique die markings in the etched backside metallization layer. The third photolithography process that defines regions where the backside metal is to be covered by a solder-resistant layer with a "via liner" etch process can be augmented to simultaneously form unique die markings in the etched solder-resistant layer. In principle, any of these photolithography processes may be used to define labels on the back of the die. In addition or in the alternative, a new photolithography step could be added specifically for this purpose, although this would increase process complexity.

Figure 17:
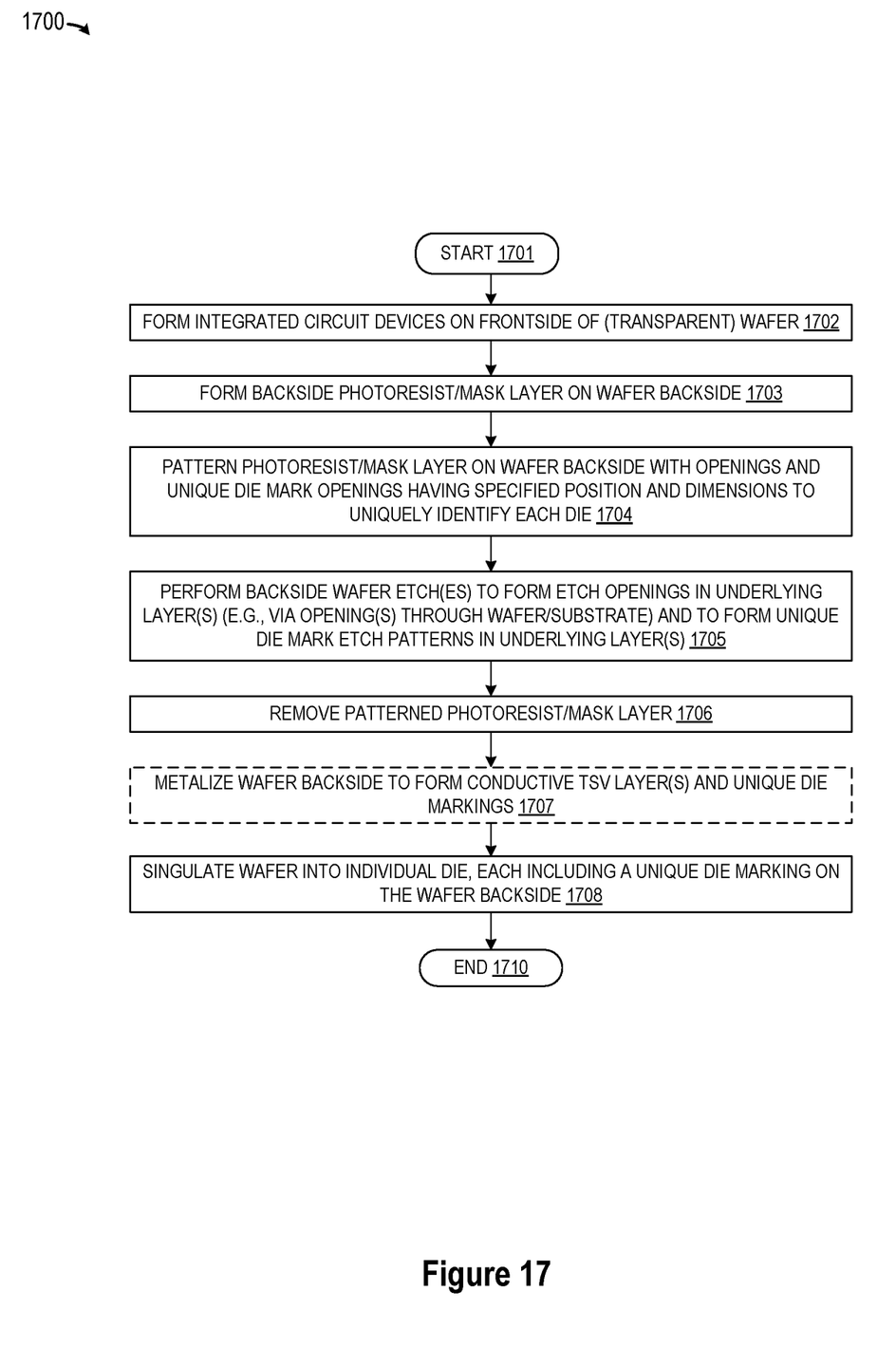
FIG. 17 is a simplified schematic flow chart illustrating a method for fabricating devices in accordance with selected embodiments of the disclosure.

To provide additional details for an improved understanding of selected embodiments of the present disclosure, reference is now made to FIG. 17 which depicts a simplified flow chart showing the process flow for fabricating a semiconductor device having unique die identification markings using backside photolithography processes. After the process starts at step 1701, a sequence of sequence of fabrication steps are performed at step 1702 to provide or fabricate a wafer substrate having integrated circuit devices formed on a frontside of the wafer substrate. With respect to the fabrication step 1702, there may be a number of preliminary steps directed to preparing a wafer substrate for subsequent processing. Any bulk or composite substrate may be used as a starting material, though in selected embodiments, the wafer is formed with a transparent semiconductor substrate, such as, without limitation, gallium arsenide (GaAs), indium phosphide (InP), gallium nitride (GaN), silicon carbide (SiC), barium tin oxide (BaSnO), or the like. In the frontside of the wafer substrate, the fabrication of the integrated circuit devices may include forming epitaxial semiconductor layers, buried insulator layers, buried n-type or p-type doped layers, deep and shallow trench isolation regions, field oxide regions, insulator layers, doped n-type and/or p-type well regions, gate electrodes, sidewall implant masks, source/drain implant regions, body contact regions, and one or more metal interconnect structures and/or contact pads. With these and other fabrication steps, any desired integrated circuit devices can be formed on the wafer frontside, including but not limited to input/output pads, probe pads, identifying marks, fiducial markings, or active device components. In selected embodiments, the integrated circuit devices are positioned to leave "open" a viewing area through which the wafer backside can be optically inspected. In other embodiments, there is no viewing area left "open" on the wafer frontside. Of course, the selection and order of which features are formed may vary as needed for any particular integrated circuit application. It will be appreciated that additional processing steps will be used to fabricate the semiconductor device described herein. In addition, other circuit features may be formed on the wafer structure, such as capacitors, diodes, etc. As examples, one or more sacrificial oxide formation, stripping, isolation region formation, well region formation, gate dielectric and electrode formation, extension implant, halo implant, spacer formation, source/drain implant, heat drive or anneal steps, and polishing steps may be performed, along with conventional back-end processing, typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

At step 1703, a backside photoresist and/or mask layer is formed on the wafer backside using a photolithography processing step. Depending on which underlying layers on the wafer backside will be etched, the processing at step 1703 may form a single layer of photoresist or a multi-layer mask layer. For example, when using a first photolithography process that defines through-wafer vias when etching the substrate with a "backside via" process, a multi-layer mask layer may be formed by sequentially forming a first anti-reflective coating on the wafer backside, followed by deposition of a nitride hardmask layer and then application of photoresist over the nitride hardmask layer. Alternatively, when using a second photolithography process that removes portions of the full-thickness backside metallization layer with a "street" process, a single layer of photoresist may be formed over the backside metallization layer. Likewise, when using a third photolithography process that defines patterned solder-resistant layer on the TSVs with a "via liner" etch process, a single layer of photoresist may be formed over the solder-resistant layer.

At step 1704, the photoresist/mask layer(s) on the wafer backside are patterned with etch openings and unique die mark openings having specified position and dimensions to uniquely identify each die. Depending on the structure of the photoresist/mask layer(s), the pattern processing at step 1704 may use any suitable patterning and etching steps to form the etch openings and unique die mark openings in the photoresist/mask layer(s). For example, when patterning a single photoresist layer, the pattern processing may include exposing the photoresist layer to a patterned light source (e.g., UV light) through a photomask (e.g., chrome on glass photomask), developing the exposed photoresist layer, and then applying an etch or strip chemistry to form the patterned photoresist layer with defined etch openings and unique die mark openings. Alternatively, when patterning a multi-layer masking technique, each of the constituent mask layers can be selectively etched to form the etch openings and unique die mark openings with suitable etch processes for each layer, including but not limited to a dry etching process such as reactive-ion etching, ion beam etching, plasma etching or laser etching, a wet etching process wherein a chemical etchant is employed, or any combination thereof. At step 1704, an existing 1X photomask used to pattern the backside photoresist/mask layer may be modified to add unique die mark openings to the existing etch openings, thereby adding unique die markings to the backside as described below for use in enabling die traceability without requiring additional photolithography steps.

As will be appreciated, the specified position and dimensions of the unique die mark openings will depend on which underlying layers on the wafer backside will be etched. For example, the processing at step 1704 may form etch openings in a multi-layer mask layer which are sufficiently wide to permit a through-semiconductor via opening to be etched through the entire wafer substrate. However, to ensure that the backside die mark etch openings are not etched all the way through the wafer substrate, the dimensions of the unique die mark openings are constrained to be smaller than for the via etch openings. When this is done, the aspect ratio—that is, the depth of the etched feature compared to the width of that feature—is much higher for the backside die mark etch openings than for the via etch openings. As a result, when the via holes have successfully been etched through the entire thickness of the substrate, the label pattern will not be as deep. In similar fashion, the position and dimensions of the backside die mark etch openings may be adjusted base on the type and thickness of underlying being etched. For example, if a backside metallization layer is being etched, a first set of position and dimensions may be used for the backside die mark etch openings which take into account the etch properties of the backside metallization layer. However, if a solder-resistant polymer material is being etched, a second, different set of position and dimensions may be used for the backside die mark etch openings which take into account the etch properties of the solder-resistant polymer material.

If a street or via liner photolithography process is used to etch the underlying backside metal or solder resistant layers, the resulting unique die mark etch patterns may define a backside label as any pattern which is unique at the die level, such as an alphanumeric label, bar coding, binary pattern, etc. In order to maintain backside label visibility from the front of the die, the unique die mark etch pattern should provide a contrast between regions which have backside unique die mark etch patterns and the regions or layers which do not. If the backside label lies inside the active die region, then the requirement of providing visibility contrast may require that portions of the die backside which would normally be metallized will be metal-free which could interfere with some types of die attach processes. On the other hand, if the backside label is located in the saw scribe lines between active die, then the label could be damaged or destroyed by the die singulation process. These challenges introduce constraints on die and product design that can be overcome with appropriate placement and formation of the unique die mark etch patterns. For example, the "backside via" photolithography process for etching the unique die mark etch patterns in the substrate can avoid those constraints without having to add a new backside photo step or making any modifications to any other mask layers. For example, at any point in backside processing before backside metallization is applied, the label pattern could be defined in a material which has a morphology or color contrast compared to the backside metallization, such as by etching of a sputtered material or liftoff of an evaporated material. Because this pattern would be defined before the backside metallization is deposited, it would be visible from the front of the die even if subsequently covered by backside metallization. However, this would require introduction of a new photo step, resulting in some increase in wafer cost and cycle time.

At step 1705, one or more backside wafer etch steps are applied to form etch openings and unique die mark etch patterns in the underlying layers(s) based on the patterned etch openings and unique die mark openings from the backside photoresist/mask. Depending on the underlying layer(s) being etched, the etch processing at step 1705 may use any suitable etching processes, including but not limited to a dry etching process such as reactive-ion etching, ion beam etching, plasma etching or laser etching, a wet etching process wherein a chemical etchant is employed, or any combination thereof. For example, when using a first photolithography process that defines through-wafer vias when etching the substrate with a "backside via" process, an anisotropic etch chemistry may be used that is selective to the semiconductor material of the substrate so that only the exposed portions of the substrate are removed when forming the etch openings and unique die mark etch patterns in the substrate. And by controlling the dimension size of the etch openings and unique die mark openings in the photoresist/mask layer, the controlled etch process can etch a through-semiconductor via opening that extends completely through the wafer substrate while simultaneously etching the unique die mark etch patterns that etch only partially through the wafer substrate. Alternatively, when using "street" or "via liner" etch process, the etch chemistry is selected to define etch openings and unique die mark etch patterns in the underlying backside metal layer or solder-resistant layer. By properly patterning the photoresist/mask layer to define unique die mark openings, the resulting unique die mark etch patterns should not etch all the way through the substrate, thereby avoiding any requirement of including a metal "catchpad" at the front of the wafer to prevent the holes from causing issues during subsequent wafer processing and product assembly. Such catchpads could obscure visibility of the unique die mark etch patterns from the front of the die, thereby interfering with its utility as a label.

At step 1706, the patterned photoresist/mask layer is removed from the wafer backside. As disclosed herein, the patterned photoresist/mask layer may be removed after etching the unique die mark etch pattern using any suitable chemical etch or strip process, leaving behind the unique die mark etch pattern. The processing to remove the patterned photoresist/mask layer not only helps promote planarization of the final device, but also helps remove potential contaminants and interactions that can occur when photoresist materials interact with the underlying layers.

As indicated with the dashed box at step 1707, an optional processing step may be included to metalize the wafer backside to form one or more conductive layers to partially or completely fill the etch openings and unique die mark openings formed in the wafer backside. Depending on which photolithography processes are used, the step of metalizing the backside wafer may be skipped, such as when the unique die markings are formed from patterned backside metal layer or solder-resistant layer.

At step 1708, the fabrication of the semiconductor device may continue with singulation of the wafer into individual chip scale integrated circuit die, each of which includes a unique die marking on the wafer backside. While any suitable singulation process, may be used, in selected embodiments, the wafer backside may be attached to a first carrier with dicing tape which may include epoxy. With the wafer affixed to the first carrier, the wafer may be singulated by cutting individual circuit dies with a mechanical or laser blade along the scribe lines 103 between adjacent dies 102. By positioning the unique die markings to be located outside of the inter-die wafer area or saw street lines 103, this results in each integrated circuit die including a unique die marking on the wafer backside.

While selected embodiments are described with reference to a backside label that is formed on a die which is to be packaged with the wafer frontside "face up," it will be appreciated selected embodiments of the present disclosure may also be used with any die that is packaged "face down," such as a flip-chip die (where the I/O connections made through bumps on the front of the die) or so-called inverted die (where I/O connections made using bond wires attached to the backside of the die). With "face down" die, the layout and process constraints on the die label are somewhat different compared to the "face up" embodiments. For example, when the wafer backside of the die is on the more easily inspected side, unique labelling on the backside is attractive for all wafer technologies, regardless of whether the substrate is optically transparent.

For flip-chip wafer technologies, any existing backside photo level may be used, although a 1X plate will be required for uniqueness. This 1X plate can be used either in place of an existing step-and-repeat photo process, or added as a secondary exposure for an existing step-and-repeat process. If there are no applicable existing backside photo levels, then a new level may be added.

For inverted-die wafer technologies, the process flow is very similar to that for standard "face up" products. For example, GaN-based RF power IC could use a first backside photolithography and etch process to form backside vias on the thinned wafer to form a first unique label and/or use a second backside photolithography and etch process to form backside metallization on the thinned wafer to form a second unique label. However, the backside photolithography and etch process for etching a solder resistant layer is not necessary because the backside of the die is not exposed to solder in the inverted-die configuration. For this configuration, either or both of the remaining backside layers (backside via, street) may be used to form the unique die label. Alternatively, a new photo step could be added specifically for this purpose, although of course this would increase process complexity.

At step 1710, the fabrication methodology ends. With the backside unique die markings fabricated on each die (or grid or array of die), each of the integrated circuit die may be inspected by inspecting or identifying the unique die marking on each die, either before or after the singulation step. In situations where the (singulated) wafer die are still attached on the first carrier by the dicing tape, the wafer arranged with the singulated dies may be transported from the first machine to an inspection station for checking and examining each die, such as defects on conductive bumps disposed on the die, cracks within the die or etc. As part of the inspection, each individual die may be identified by inspecting the semiconductor die labels on the backside of the die which are visible from the front of the die using optical microscope. With transparent substrates, the inspection of backside die labels can be readily performed with an optical microscope when there is an unimpeded viewing area to the backside label. Even when there is overlap between frontside device features and the backside label, the backside label can be inspected with an optical microscope merely by changing the focus depth based on the thickness of the substrate (e.g., the backside label may be located at least 20 µm below the frontside label).

By now it should be appreciated that there is provided herein an integrated circuit die and method for fabricating or making same. In the disclosed methodology, a wafer is provided or fabricated having a backside surface and an opposing frontside on which a plurality of integrated circuit die is formed over a shared wafer semiconductor substrate and arranged in a grid. In some embodiments, the shared wafer semiconductor substrate is a transparent semiconductor material. In other embodiments, the underlying layer on the backside of a wafer is the shared wafer semiconductor substrate, and in other embodiments, the underlying layer is a layer formed on the shared wafer semiconductor substrate. Subsequently, a photoresist layer is deposited to cover an underlying layer located on the backside of the wafer, and then patterned and developed to define a patterned photoresist mask which includes, for each integrated circuit die, a unique set of one or more openings in the patterned photoresist mask. By using the patterned photoresist mask to selectively etch the underlying layer, there is formed, on each integrated circuit die, a unique die mark identifier pattern of etched openings in the underlying layer corresponding to the unique set of one or more openings in the patterned photoresist mask. In embodiments where the underlying layer located on the backside of a wafer is a backside metal layer that is deposited on the backside of the wafer to form a through-semiconductor via structure, the unique die mark identifier pattern of etched openings is formed in the backside metal layer. In other embodiments where the underlying layer located on the backside of a wafer is a solder resistant layer that is deposited on the backside of the wafer to cover a through-semiconductor via structure, the unique die mark identifier pattern of etched openings is formed in the backside solder resistant layer. After removing the patterned photoresist mask from the backside of the wafer, the wafer is then singulated to form a plurality of integrated circuit devices, wherein singulating the wafer is done after forming the unique die mark identifier pattern of etched openings in the underlying layer for each of the plurality of integrated circuit die. In selected embodiments, a metal layer is deposited over the backside of the wafer after removing the patterned photoresist mask to fill the unique die mark identifier pattern of etched openings in the underlying layer before wafer singulation occurs. In selected embodiments, each integrated circuit die's unique die mark identifier pattern of etched openings in the underlying layer is located in alignment with a viewing area defined in the opposing frontside of the wafer where there are no visual obstructions to optically inspecting, through the shared wafer semiconductor substrate, the unique die mark identifier pattern of etched openings in the underlying layer. In addition, each unique die mark identifier pattern of etched openings formed on each integrated circuit die may be embodied as an alphanumeric label, bar coding label, binary pattern, or die-specific pattern which is unique for the integrated circuit die.

In another form, there is provided a chip device and method for fabricating or making same. In the disclosed methodology, photoresist is applied over a backside of a wafer having a plurality of chips, and then patterned and developed to form a patterned backside photoresist mask with a plurality of unique patterned mask openings. In selected embodiments, the wafer includes a shared wafer semiconductor substrate formed with a transparent semiconductor material. The patterned backside photoresist mask is used to form a unique die mark identifier pattern on the backside of the wafer which corresponds to the plurality of unique patterned mask openings. As formed, the unique die mark identifier pattern includes a first unique pattern for a first set of one or more chips and a second unique pattern for a second set of one or more chips. For example, the first unique pattern formed on the first set of one or more chips may be an alphanumeric label, bar coding label, binary pattern, or die-specific pattern which is unique for the first set of one or more chips. At or after forming the unique die mark identifier pattern, the patterned backside photoresist mask is removed from the backside of the wafer to leave the unique die mark identifier pattern in place. Subsequently, the wafer is singulated to form a plurality of chip devices. In selected embodiments, the patterned backside photoresist mask is formed on an underlying layer located on the backside of a wafer, where the underlying layer may be the wafer substrate, a backside metal layer, or a backside solder resistant layer. For example, the patterned backside photoresist mask may be used to form the unique die mark identifier pattern by selectively etching the underlying layer using the patterned backside photoresist mask to form the unique die mark identifier pattern as etched openings in the underlying layer corresponding to the plurality of unique patterned mask openings. In such embodiments, a metal layer may be deposited over the backside of the wafer after removing the patterned backside photoresist mask to form at least a conformal metal layer in the etched openings in the underlying layer. In another example where the underlying layer is a backside metal layer that is deposited on the backside of the wafer to form a through-semiconductor via structure, the unique die mark identifier pattern may be formed with a first unique backside metal pattern in the backside metal layer for the first set of one or more chips and a second unique backside metal pattern in the backside metal layer for the second set of one or more chips. In yet another example, where the underlying layer is a backside solder resistant layer that is deposited on the backside of the wafer to cover a through-semiconductor via structure, the unique die mark identifier pattern may be formed by with first unique solder resistant layer pattern for the first set of one or more chips and a second unique solder resistant layer pattern for the second set of one or more chips. In selected embodiments where the patterned backside photoresist mask is formed on the backside of a wafer, the patterned backside photoresist mask may be used to form the unique die mark identifier pattern by electroplating a metal layer with the patterned backside photoresist mask in place to form the unique die mark identifier pattern as electroplated metal in the plurality of unique patterned mask openings. As formed on a backside of each chip, the unique die mark identifier pattern is located in alignment with a viewing area defined in an opposing frontside of the chip where there are no visual obstructions to optically inspecting, through semiconductor substrate of the chip, the unique die mark identifier pattern.

In yet another form, there is provided an integrated circuit device and method for fabricating same. As disclosed, the integrated circuit device includes a semiconductor substrate having a backside surface and an opposing frontside surface on which integrated circuit device features are formed. The integrated circuit device also includes a patterned unique die mark identifier formed on the backside surface of the semiconductor surface using a patterned photoresist mask that is removed after forming the patterned unique die mark identifier. As formed, the patterned unique die mark identifier includes an alphanumeric label, bar coding label, binary pattern, or die-specific pattern which is unique for the integrated circuit device and which does not include photoresist. In selected embodiments, the semiconductor substrate is a transparent semiconductor substrate. In addition, the patterned unique die mark identifier may be formed in the backside surface of the semiconductor substrate, in a backside metal layer of a through-semiconductor via structure, or a backside solder resistant layer formed over a through semiconductor via structure.

Although the described exemplary embodiments disclosed herein are directed to various backside unique die mark etch patterns and methods for making same with backside photolithography processing steps, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are formed on transparent or thinned semiconductor substrates, this is merely for convenience of explanation and not intended to be limiting and persons of skill in the art will understand that the principles taught herein apply to devices of any suitable wafer substrate. Moreover, the fabrication processing steps for making the backside unique die mark etch patterns may be adjusted and reordered as required for the required application. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making an integrated circuit die, comprising:
   depositing a photoresist layer on an underlying layer located on a backside of a wafer which comprises an opposing frontside on which a plurality of integrated circuit die is formed over a shared wafer semiconductor substrate and arranged in a grid;
   patterning and developing the photoresist layer to define a patterned photoresist mask comprising, for each integrated circuit die, a unique set of one or more openings in the patterned photoresist mask;
   selectively etching the underlying layer using the patterned photoresist mask to form, on each integrated circuit die, a unique die mark identifier pattern of etched openings in the underlying layer corresponding to the unique set of one or more openings in the patterned photoresist mask;
   removing the patterned photoresist mask from the backside of the wafer; and
   singulating the wafer to form a plurality of integrated circuit devices, wherein singulating the wafer is done after forming the unique die mark identifier pattern of etched openings in the underlying layer for each of the plurality of integrated circuit die.

2. The method of claim 1, wherein the shared wafer semiconductor substrate comprises a transparent semiconductor material.

3. The method of claim 1, where the underlying layer located on the backside of a wafer is the shared wafer semiconductor substrate.

4. The method of claim 3, further comprising depositing a metal layer over the backside of the wafer after removing the patterned photoresist mask to fill the unique die mark identifier pattern of etched openings in the underlying layer.

5. The method of claim 1, where the underlying layer located on the backside of a wafer is a backside metal layer that is deposited on the backside of the wafer to form a through-semiconductor via structure.

6. The method of claim 1, where the underlying layer located on the backside of a wafer is a solder resistant layer that is deposited on the backside of the wafer to cover a through-semiconductor via structure.

7. The method of claim 1, where, for each integrated circuit die, the unique die mark identifier pattern of etched openings in the underlying layer is located in alignment with a viewing area defined in the opposing frontside of the wafer where there are no visual obstructions to optically inspecting, through the shared wafer semiconductor substrate, the unique die mark identifier pattern of etched openings in the underlying layer.

8. The method of claim 1, where the unique die mark identifier pattern of etched openings formed on each integrated circuit die comprises an alphanumeric label, bar coding label, binary pattern, or die-specific pattern which is unique for the integrated circuit die.

9. A method for making a chip device comprising:
   applying, patterning, and developing photoresist over a backside of a wafer comprising a plurality of chips to form a patterned backside photoresist mask with a plurality of unique patterned mask openings, where the patterned backside photoresist mask is formed on an underlying layer located on the backside of a wafer;
   using the patterned backside photoresist mask to form, on the backside of the wafer, a unique die mark identifier pattern corresponding to the plurality of unique patterned mask openings, where the unique die mark identifier pattern comprises a first unique pattern for a first set of one or more chips and a second unique pattern for a second set of one or more chips;
   removing the patterned backside photoresist mask from the backside of the wafer to leave the unique die mark identifier pattern in place; and
   singulating the wafer to form a plurality of chip devices.

10. The method of claim 9, wherein the wafer comprises a shared wafer semiconductor substrate formed with a transparent semiconductor material.

11. The method of claim 9, where using the patterned backside photoresist mask to form the unique die mark identifier pattern comprises selectively etching the underlying layer using the patterned backside photoresist mask to form the unique die mark identifier pattern as etched openings in the underlying layer corresponding to the plurality of unique patterned mask openings.

12. The method of claim 11, further comprising depositing a metal layer over the backside of the wafer after removing the patterned backside photoresist mask to form at least a conformal metal layer in the etched openings in the underlying layer.

13. The method of claim 9, where the underlying layer comprises a backside metal layer that is deposited on the backside of the wafer to form a through-semiconductor via structure and where the unique die mark identifier pattern comprises a first unique backside metal pattern for the first set of one or more chips and a second unique backside metal pattern for the second set of one or more chips.

14. The method of claim 9, where the underlying layer comprises a solder resistant layer that is deposited on the backside of the wafer to cover a through-semiconductor via structure and where the unique die mark identifier pattern comprises a first unique solder resistant layer pattern for the first set of one or more chips and a second unique solder resistant layer pattern for the second set of one or more chips.

15. The method of claim 9, where the patterned backside photoresist mask is formed on the backside of a wafer and where using the patterned backside photoresist mask to form the unique die mark identifier pattern comprises electroplating a metal layer with the patterned backside photoresist mask in place to form the unique die mark identifier pattern as electroplated metal in the plurality of unique patterned mask openings.

16. The method of claim 9, where the first unique pattern formed on the first set of one or more chips comprises an alphanumeric label, bar coding label, binary pattern, or die-specific pattern which is unique for the first set of one or more chips.

17. The method of claim 9, where the unique die mark identifier pattern is formed on a backside of each chip and located in alignment with a viewing area defined in an opposing frontside of the chip where there are no visual obstructions to optically inspecting, through semiconductor substrate of the chip, the unique die mark identifier pattern.

\* \* \* \* \*